United States Patent [19]

White

[11] Patent Number: 4,593,270
[45] Date of Patent: Jun. 3, 1986

[54] SUCCESSIVE APPROXIMATION ANALOG TO DIGITAL CONVERTER

[75] Inventor: Robert White, Tucson, Ariz.

[73] Assignee: Burr-Brown Corporation, Tucson, Ariz.

[21] Appl. No.: 622,259

[22] Filed: Jun. 19, 1984

[51] Int. Cl.[4] .............................................. H03N 1/38
[52] U.S. Cl. ........................ 340/347 AD; 340/347 M
[58] Field of Search .................................. 340/347 AD

[56] References Cited

U.S. PATENT DOCUMENTS

4,454,500  6/1984  Kato et al. ................... 340/347 AD

Primary Examiner—William M. Shoop, Jr.
Assistant Examiner—Saul M. Bergmann
Attorney, Agent, or Firm—Harry M. Weiss & Associates

[57] ABSTRACT

An analog-to-digital converter is used in conjunction with a digital to analog converter and a comparison network to provide a group of digital signals that, when applied to a digital-to-analog converter, produce an output signal approximating an applied input signal. The analog-to-digital converter includes a clock circuit, a series of bistable multivibrator circuits, a master latch circuit, a plurality of slave latch circuits, and associated logic circuits. The bistable multivibrators are arranged to produce a sequence of activation signals in response to operation of the clock circuit. The activation signals serve to place slave latches circuits sequentially in a positive logic status temporarily, each slave latch output terminal being associated with a binary signal of decreasing significance in approximating the applied input signal. The output signal of the digital-to-analog converter is compared with the applied input signal. A signal resulting from the comparison of these signals is applied through the master latch circuit to the activated slave latch circuit and this comparison signal determines whether a positive or negative logic signal is latched at the output terminal of the slave latch circuit. The multivibrator circuits then activate the next slave latch circuit in sequence until the last slave latch circuit is activated. The analog-to-digital converter is implemented in current mode (steering mode) logic and compatible components to permit the circuit to be fabricated on a single chip.

16 Claims, 10 Drawing Figures fig. 1 fig. 6 fig.2 fig. 4 fig. 5 fig. 7 fig. 8 fig. 9 fig. 10

SUCCESSIVE APPROXIMATION ANALOG TO DIGITAL CONVERTER

BACKGROUND OF THE INVENTION

1. Field of the Invention

This invention relates generally to analog-to-digital conversion devices and more particularly to apparatus for providing a representation of an electrical signal voltage by a group of binary signals that are determined by approximating the analog signal with a predetermined number of decreasing voltage levels.

2. Description of the Related Art

It is known in the related art to approximate a signal having an arbitrary potential by a multiplicity of binary states. The digitalization of the signal has the advantage of permitting convenient manipulation and transmission without the necessity of maintaining the original potential level. The approximation is typically accomplished by providing that the analog signal level is within certain boundaries, and providing that a sequence of binary states specify the absence or presence of an amplitude component in a sequence of components with decreasing amplitude. A typical example can occur where, beginning with an arbitrary amplitude, each successive binary state represents a magnitude one-half of the magnitude represented by the previous binary quantity. An approximation of the original signal can be reconstructed from the multiplicity of binary states by means of a digital to analog converter, wherein each binary state is electrically summed to provide a reconstruction of the original signal level.

The instant invention relates to the method of providing the multiplicity of binary states by testing the inclusion of each decreasing amplitude component against the original signal. If the partially reconstructed signal is tested to be less than the original signal, then the component under test is included in the group of binary states. If the reconstructed signal is greater than the original signal, the component most recently tested is not used and the next smaller amplitude component is tested. In this manner, the original signal can be approximated to a accuracy limited only by the number of binary quantities available and the error margins of the testing apparatus.

SUMMARY OF THE INVENTION

It is therefore an object of the present invention to provide an improved apparatus for analog to digital conversion using successive approximation techniques.

It is a more particular object of the present invention to provide a series of bistable elements for providing a sequence of activation signals in response to a clock signal permitting a testing of a series of predetermined output signal levels.

It is another particular object of the present invention to provide apparatus for testing a sequence of decreasingly significant binary state signals and, where appropriate, latching or maintaining the signals to provide an approximation of an input signal level when used in conjunction with a digital-to-analog converter.

It is still another particular object of the present invention to provide apparatus for temporarily applying an output signal and, based on the results of external decision apparatus, latching the signal or latching the logical complement of the applied output signal.

It is yet another object of the present invention to provide apparatus implemented with current mode logic techniques for providing successive approximation analog to digital conversion.

The aforementioned and other objects of the present invention are accomplished according to the present invention by a clock circuit, a series of bistable multivibrators, a series of slave latch circuits associated with the multivibrators, a master latch circuit and associated logic elements. In response to an initial signal, the clock circuit provides a series of pulses and activates the multivibrators in a predetermined sequence. The output signals of the multivibrators activate the associated slave latch circuits. The slave latch circuits each set a positive logic signal temporarily. The positive logic signal causes external signal processing that results in the application of a logic signal to the master latch circuit. Depending on the signal applied to the master latch circuit, a positive or a negative logic signal can be latched in the activated slave latch circuit. During the next clock cycle, the process is continued for the next sequential multivibrator and associated latch circuit. After the sequence of multivibrators has been actuated, a signal is generated which interrupts the sequence of clock pulses. The invention can be implemented in current mode logic technology and includes apparatus for minimizing the effect a voltage drop along a conducting lead supplying power to the circuits as well as circuit design techniques for minimizing the number of elements.

These and other features of the present invention will be understood upon reading of the following description along with the drawings.

DETAILED DESCRIPTION OF THE DRAWINGS

Figure 1:
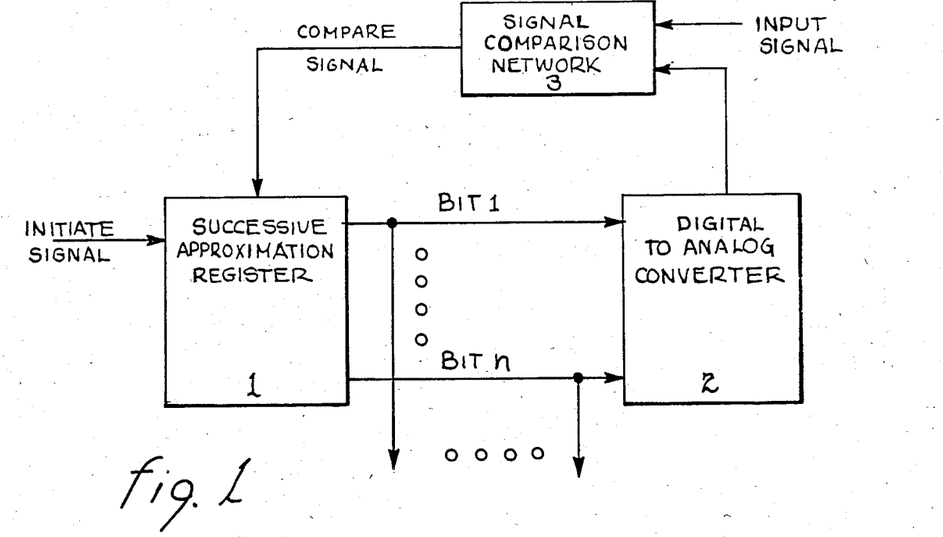
FIG. 1 is a schematic block diagram of a complete configuration for providing a digital signal approximation of an applied input signal.

Referring to FIG. 1, successive approximation register 1 receives an initiate signal and an output signal from signal comparison network 3, and applies signal bit 1 through signal bit n to digital to analog converter 2. Signal bits 1 through n are also the output signals of the successive approximation register 1 and provide a digital representation of the input signal at completion of the conversion. Signal comparison network 3 receives the input signal and compares the signal with the output signal of the digital to analog converter. device 2.

Figure 2:
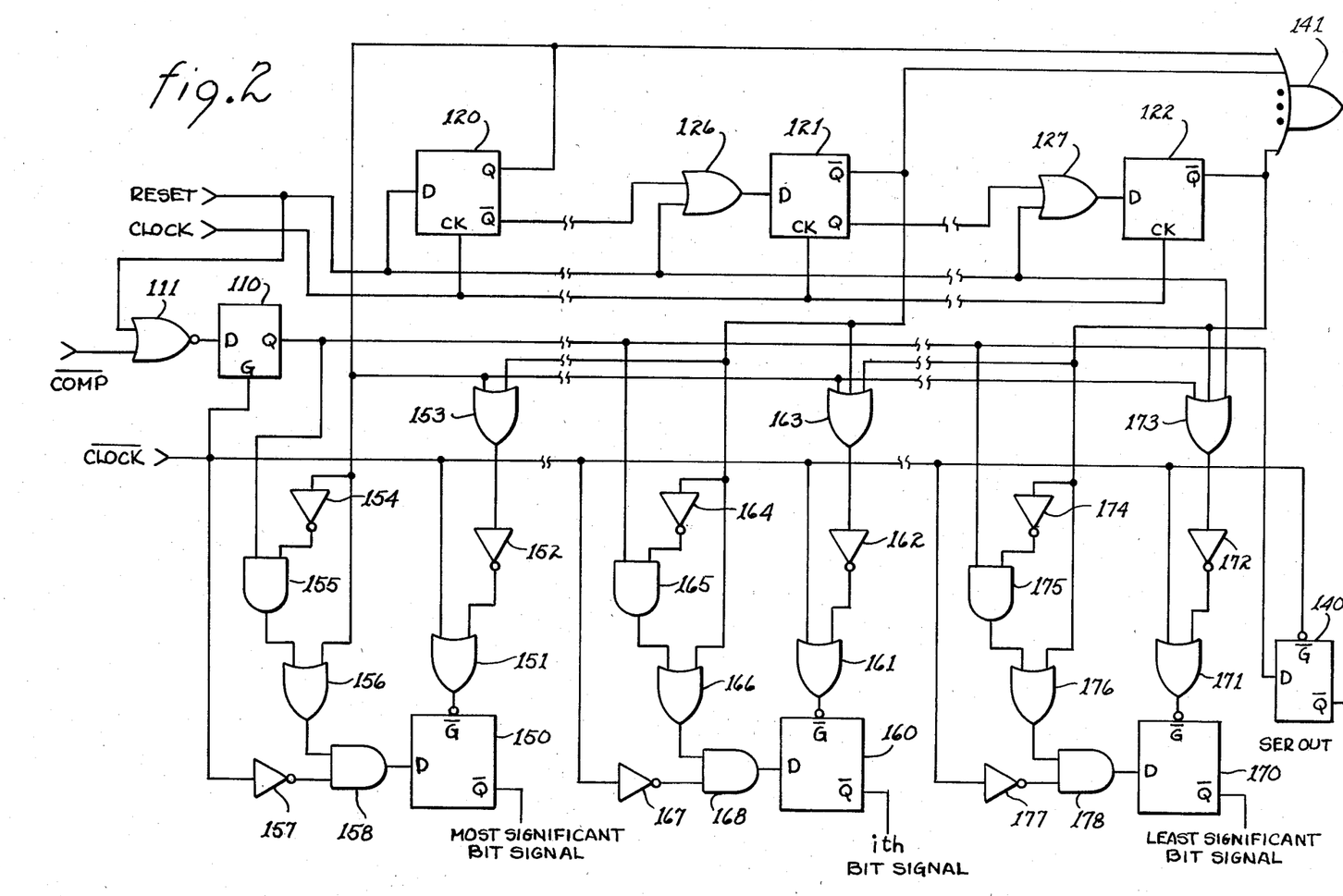
FIG. 2 is a block diagram of the successive approximation register circuit of the instant invention.

Referring to FIG. 2, the initial or input group of electrical elements, a final or output group of electrical elements, and an exemplary intermediate or ith group of electrical elements is shown for the successive approximation register of the instant invention. For the initial or input group of elements a reset signal and a compare signal are applied to input terminals of logic NOR gate 111. The output terminal of logic NOR gate 111 is coupled to the D terminal of data latch 110. The G terminal of the data latch 110 is coupled to a $\overline{\text{clock}}$ signal, while the Q terminal of the data latch 110 is coupled to an input terminal of logic AND gate 155. The reset signal is coupled to the D terminal of the bistable multivibrator (flip-flop) 120, while the clock signal is applied to the CK terminal of flip-flop 120. The Q terminal of flip-flop 120 is coupled to an input terminal of logic OR gate 141, through logic signal inverter 154 to an input terminal of logic AND gate 155, to an input terminal of logic OR gate 153, and to an input terminal of logic OR gate 156. The $\overline{Q}$ terminal of the flip-flop circuit 120 is coupled to an input terminal of a logic OR gate and the output terminal of the logic OR gate is coupled to the D terminal of a flip-flop circuit in the succeeding of elements. The output terminal of logic AND gate 155 is coupled to a second input terminal of logic OR gate 156, while the output terminal of logic OR gate 156 is coupled to an input terminal of logic AND gate 158. The $\overline{\text{clock}}$ signal is coupled through logic signal inverter 157 to a second input terminal of logic AND gate 158, while the output terminal of logic AND gate 158 is coupled to the D terminal of data latch element 150. The second input terminal of logic OR gate 153 is coupled to the $\overline{Q}$ terminal of the flip-flop circuit in the succeeding group of elements. The output terminal of logic OR gate 153 is coupled through logic signal inverter 152 to an input terminal of logic OR gate 151. A second input terminal of logic OR gate 151 is coupled to the $\overline{\text{clock}}$ signal, while the output terminal of logic OR gate 151 is coupled to logic signal inverter of the G terminal of data latch 150. The $\overline{Q}$ terminal of data latch 150 is the most significant bit signal of the analog-to-digital converter.

With respect to the exemplary intermediate ith group of elements for the successive approximation analog-to-digital converter, the reset signal is applied to a first input terminal of logic OR gate 126, while a second input terminal of logic OR gate 126 is coupled to a Q terminal of the preceding flip-flop circuit (unless the preceding flip-flop circuit is the flip-flop 120 of the initial group of elements in which case the second terminal of logic OR gate 126 is coupled to the $\overline{Q}$ terminal). The output terminal of logic OR gate 126 is coupled to the D terminal of flip-flop 121. The clock signal is coupled to the CK terminal of flip-flop 121, while the Q terminal of flip-flop 121 is coupled to an input terminal of a logic OR gate of the succeeding group of elements, the output terminal of the OR gate being coupled to the D terminal of the flip-flop in the succeeding group of elements. The $\overline{Q}$ terminal of flip-flop 121 is coupled to an ith input terminal of logic OR gate 141, to a second input terminal of logic OR gate 163, through logic signal inverter 164 to a first input terminal of logic AND gate 165, to an input terminal of logic OR gate 166 and to a third terminal of a logic OR gate of the preceding group of elements, the logic OR gate being coupled also to the Q terminal of flip-flop 120 and to the Q terminal of the flip-flop of the succeeding group of elements (unless the exemplary group is coupled to the initial element group in which case the $\overline{Q}$ terminal of the second element group is coupled to logic OR gate 153. A first input terminal of logic OR gate 163 is coupled to the Q terminal of flip-flop circuit 120 while a third input terminal of logic OR gate 163 is coupled to the $\overline{Q}$ terminal of the flip-flop circuit of the succeeding group of elements. The output terminal of logic OR gate 163 is coupled through logic signal inverter 162 to an input terminal of logic OR gate 161. A second input terminal of logic OR gate 161 is coupled to the $\overline{\text{clock}}$ signal, while the output terminal of logic OR gate 161 is coupled to a logic signal inverting element coupled to the G terminal of data latch 160. The Q terminal of data latch 110 is coupled to a second input terminal of logic AND gate 165, while the output terminal of logic AND gate 165 is coupled to a second input terminal of logic OR gate 166. The $\overline{\text{clock}}$ signal is coupled through logic signal inverter 167 to a first input terminal of logic AND gate 168, while a second input terminal of logic AND gate 168 is coupled to the output terminal of logic OR gate 166. The output terminal of logic AND gate 168 is coupled to the D terminal of data latch 160. The $\overline{Q}$ terminal of data latch 160 is the ith bit signal.

For the final group of elements in the sequence, the reset signal is applied to a first terminal of logic OR gate 127, while a second input terminal of logic OR gate 127 is coupled to the Q terminal of the flip-flop circuit of the preceding group of elements. The output terminal of logic OR gate 127 is coupled to the D terminal of flip-flop 122. The clock signal is coupled to the CK terminal of flip-flop 122. The $\overline{Q}$ terminal of flip-flop 122 is coupled to a final input terminal of logic OR gate 141, to a second terminal of logic OR gate 173, to a third terminal of an OR gate associated with the preceding group of elements (e.g., logic OR gate 163 of the exemplary intermediate element group), to a first input terminal of logic OR gate 176 and through logic signal inverter 174 to a first input terminal of logic AND gate 175. A second input terminal of logic AND gate 175 is coupled to the Q terminal of data latch 110, while the output terminal of logic AND gate 175 is coupled to a second input terminal of logic OR gate 176. The $\overline{\text{clock}}$ signal is coupled through logic signal inverter 177 to a first input terminal of logic AND gate 178, while a second input terminal of logic AND gate 178 is coupled to an output terminal of logic OR gate 176. The output terminal of logic AND gate 178 is coupled to the D terminal of data latch 170. A third input terminal logic OR gate 173 is coupled to the reset signal, while a first input terminal of logic OR gate 173 is coupled to the Q output terminal of flip-flop 120. The output terminal of logic OR gate 173 is coupled through logic signal inverter 172 to a first input terminal of logic OR gate 171, while a second input terminal of logic OR gate 171 is coupled to the $\overline{\text{clock}}$ signal. The output terminal of logic OR gate 171 is coupled to a signal inverting element coupled to the G terminal of data latch 170. The $\overline{Q}$ terminal of data latch 170 has the least significant bit signal applied thereto. The $\overline{\text{clock}}$ signal is applied through signal inverting element to G terminal of data latch 140, while the Q terminal of data latch 110 is coupled to the D terminal of data latch 140.

Figure 3:
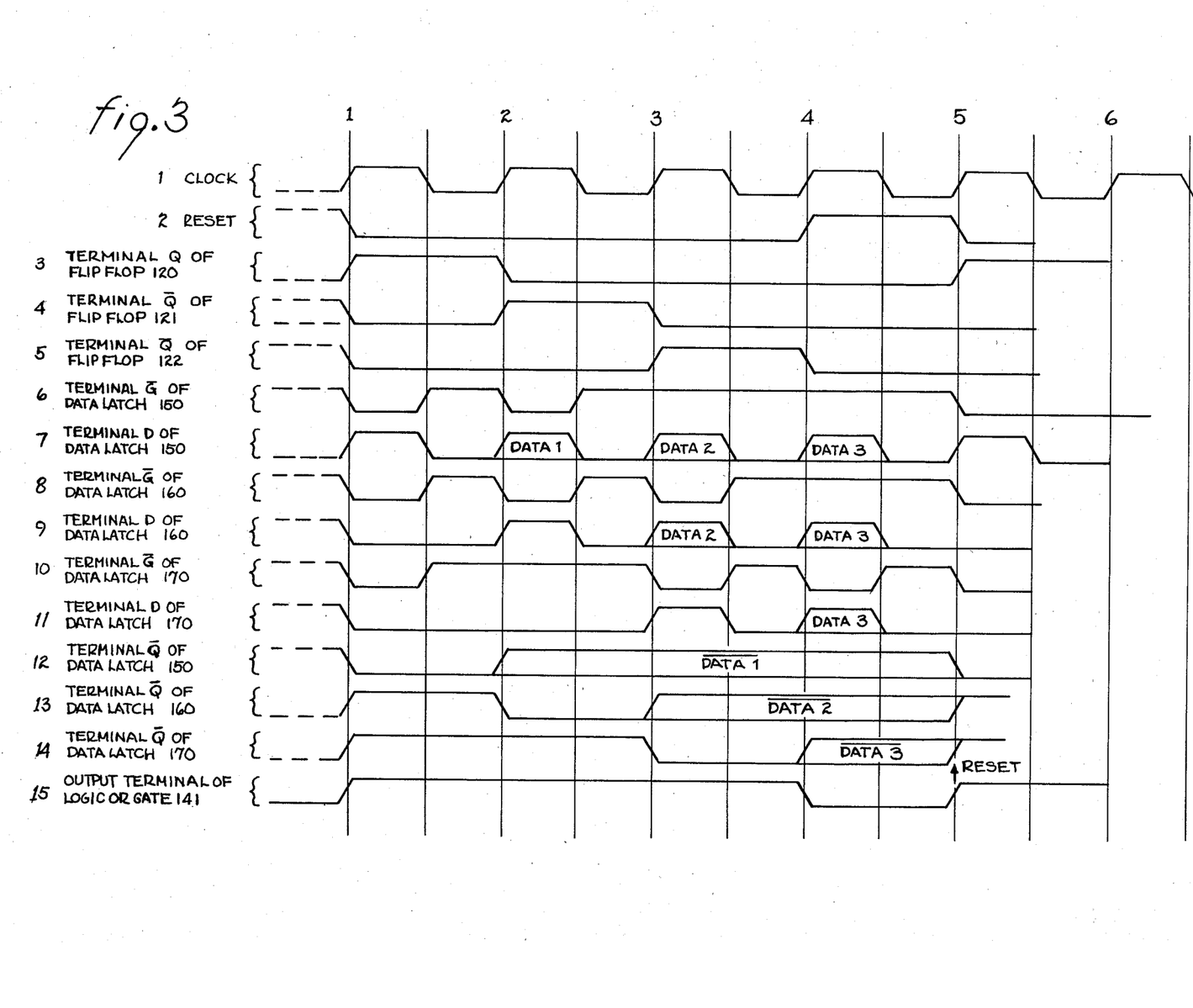
FIG. 3 is a timing diagram for the operation of the successive approximate analog-to-digital converter of FIG. 2.

Referring to FIG. 3, timing diagram of the signals available at selected terminals of instant invention is shown. The clock signal (1) is initially in a low state and upon initiation of the approximation procedure, the clock follows the indicated waveform going to a high state during the initial portion of the period and the following to a low state during the final portion of the clock period. The reset signal (2) is initially a high state signal and drops to a low state during the procedure. The third waveform of FIG. 3 displays the signal at terminal Q of flip-flop 120 while the fourth and fifth waveforms of FIG. 3 display the waveforms at terminal $\overline{Q}$ of flip-flop circuit 121 and terminal $\overline{Q}$ of flip-flop circuit 122 respectively. The next two waveforms (6 and 7) display the signal at terminal $\overline{G}$ and terminal D of data latch 150. The next four waveforms (8 to 11) indicate the signals at terminals $\overline{G}$ and D of data latch circuits 160 and 170, respectively, in relationship to the clock signals of the initial waveform of FIG. 3. The next three waveforms (12, 13 and 14) display the relationship of the signals at terminals $\overline{Q}$ of data latch circuits 150, 160 and 170 respectively. The final waveform of FIG. 3 displays the output signal of logic OR gate 141. It will be clear that the timing diagram of FIG. 3 is obtained by coupling the three stages of the successive approximation register in FIG. 2 to obtain a eight increment approximation of an input waveform. The concept can be extended to a number of stages limited by accuracy and noise constraints.

Figure 4:
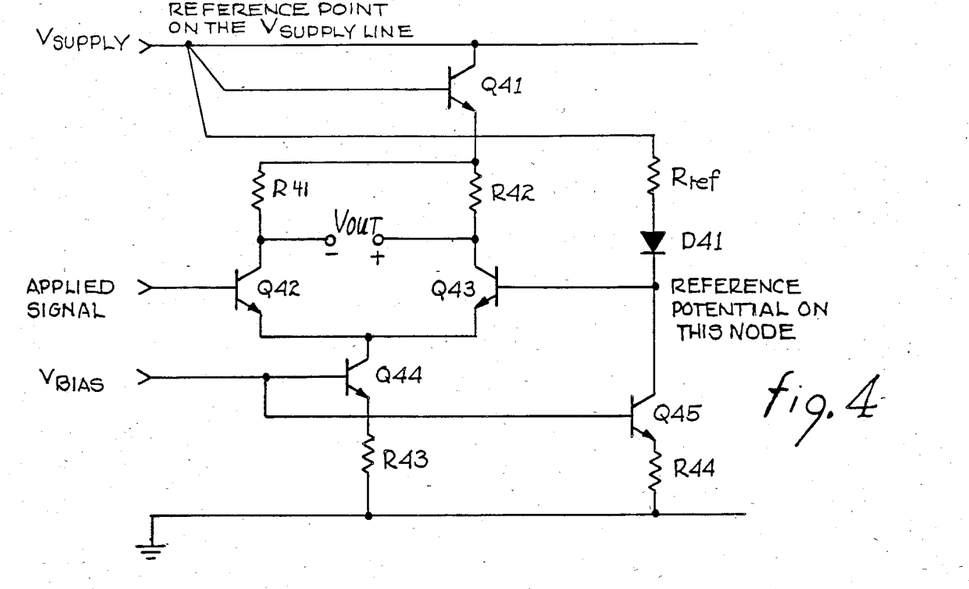
FIG. 4 is a circuit diagram of a switch circuit implemented in current mode logic according to the instant invention.

Referring to FIG. 4, a switch implemented in current mode logic is shown. The collector of transistor $Q_{41}$ is coupled to the $V_{supply}$ line. The base of transistor $Q_{41}$ is coupled through a sense line to a reference point on the $V_{supply}$ line. The reference point is coupled through resistor $R_{ref}$ to an anode of diode $D_{41}$. The emitter of transistor $Q_{41}$ is coupled through resistor $R_{41}$ to the negative terminal of the $V_{out}$ signal and to the collector terminal of transistor $Q_{42}$, and through resistor $R_{42}$ to the positive terminal of the $V_{out}$ signal out and to the collector terminal of transistor $Q_{43}$. The base terminal of transistor $Q_{42}$ is coupled to the applied signal terminal, while the emitter terminal of transistor $Q_{42}$ is coupled to the collector terminal of transistor $Q_{44}$ and to the emitter terminal of transistor $Q_{43}$. The base terminal of transistor $Q_{43}$ is coupled to the cathode terminal of diode $D_{41}$ and to the collector terminal of transistor $Q_{45}$. The base terminal of transistor $Q_{44}$ is coupled to a $V_{BIAS}$ signal and the emitter terminal is coupled through resistor $R_{43}$ to ground. The base terminal of transistor $Q_{45}$ is coupled to $V_{BIAS}$, while the emitter terminal of transistor $Q_{45}$ is coupled through resistor $R_{44}$ to ground potential.

Figure 5:
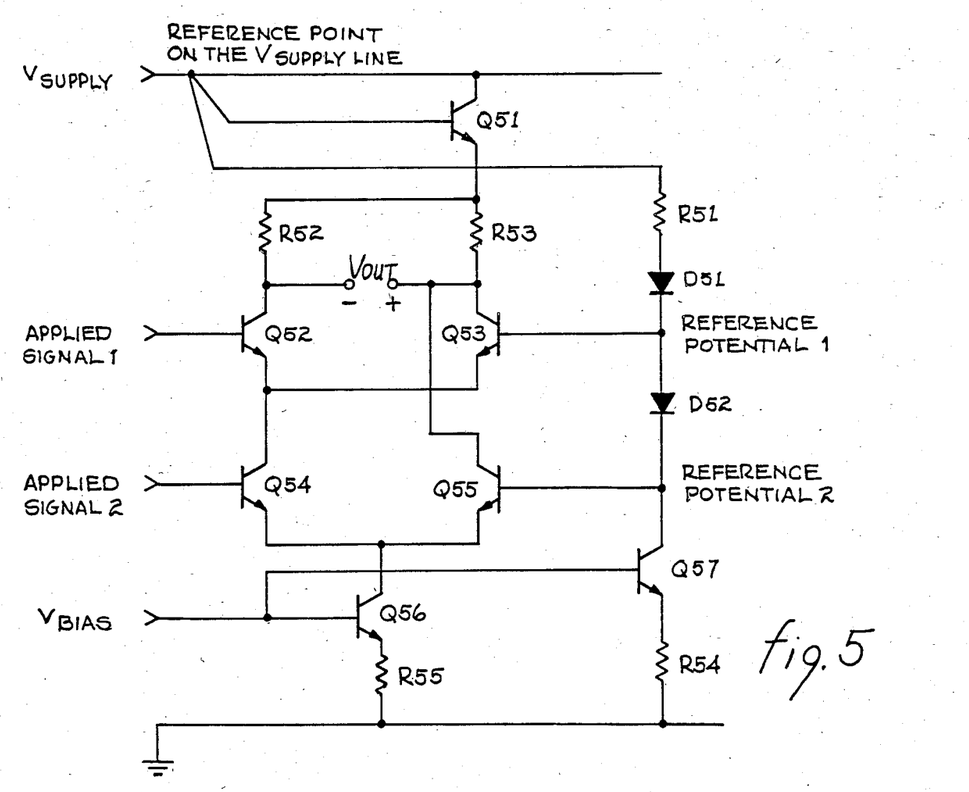
FIG. 5 is a circuit diagram of a logic AND gate implemented in current mode logic according to the instant invention.

Referring to FIG. 5, a logic AND gate implemented in current mode logic is shown. The collector terminal of transistor $Q_{51}$ is coupled to the $V_{Supply}$ lines. The base terminal of transistor $Q_{51}$ is coupled to the reference point on the $V_{supply}$ line through the sense line. The reference point is coupled through resistor $R_{51}$ to an anode terminal of diode $D_{51}$. The emitter terminal of transistor $Q_{51}$ is coupled through resistor $R_{52}$ to the negative terminal of the $V_{out}$ signal and to the collector terminal of transistor $Q_{52}$ and through resistor $R_{53}$ to the positive terminal of $V_{out}$ signal, to the collector terminal of transistor $Q_{53}$ and to the collector terminal of transistor of $Q_{55}$. The base of transistor $Q_{52}$ is coupled to Applied Signal 1, while the emitter of transistor $Q_{52}$ is coupled to the emitter of transistor $Q_{53}$ and to the collector terminal of transistor $Q_{54}$. The base terminal of transistor $Q_{54}$ is coupled to Applied Signal 2, while the emitter terminal is coupled to the emitter terminal of transistor $Q_{55}$ and to the collector terminal of transistor $Q_{56}$. The base terminal of transistor $Q_{53}$ is coupled to the cathode terminal of diode $D_{51}$ and to the anode terminal of diode $D_{52}$. The cathode terminal of diode $D_{52}$ is coupled to the base of transistor $Q_{55}$ and to the collector transistor of transistor $Q_{57}$. The base terminal of transistor $Q_{57}$ is coupled to the $V_{Bias}$ signal, while the emitter terminal is coupled through resistor $R_{54}$ to the ground potential. The base terminal of transistor $Q_{56}$ is coupled to $V_{Bias}$ signal, while the emitter terminal is coupled through resistor $R_{55}$ to the ground potential.

Figure 6:
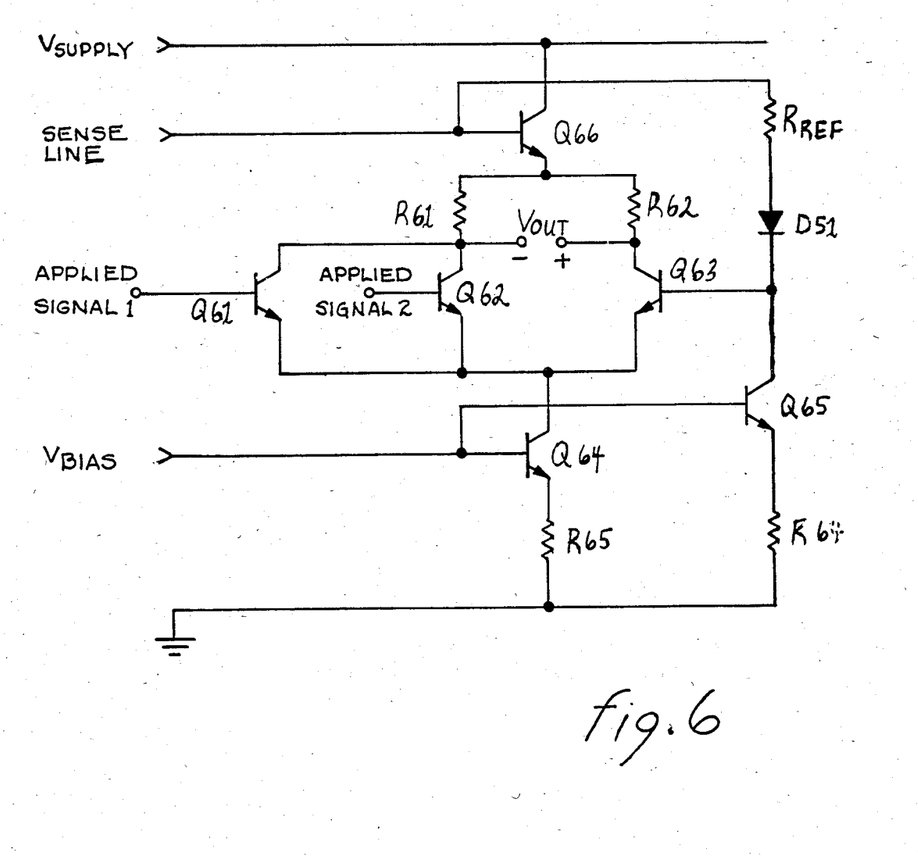
FIG. 6 is a circuit diagram of a logic OR gate implemented in current mode logic according to the instant invention.

Referring to FIG. 6, a logic OR gate implemented in current mode logic according to the instant invention is shown. The collector terminal of transistor $Q_{66}$ is coupled to the $V_{supply}$. The base terminal of transistor $Q_{66}$ is coupled to the sense line and through resistor $R_{Ref}$ to the anode terminal of diode $D_{61}$. The emitter terminal of transistor $Q_{66}$ is coupled through resistor $R_{61}$ to the negative terminal of the $V_{out}$ signal, to the collector terminal of transistor $Q_{61}$ and to the collector terminal of transistor $Q_{62}$, and through resistor $R_{62}$ to the positive terminal of the $V_{out}$ signal, and to the collector terminal of transistor $Q_{63}$. The base terminal of transistor $Q_{63}$ is coupled to the cathode terminal of diode $D_{61}$ and to the collector terminal of transistor $Q_{65}$. The base terminal of transistor $Q_{61}$ is coupled to the Applied Signal 1, while the base terminal of transistor $Q_{62}$ is coupled to the Applied Signal 2. The emitter terminal of transistor $Q_{61}$ is coupled to the emitter terminal of transistor $Q_{62}$, to the emitter terminal of transistor $Q_{63}$ and to the collector terminal of transistor $Q_{64}$. The $V_{Bias}$ signal is coupled to the base terminal of transistor $Q_{65}$ and the base terminal of transistor $Q_{64}$. The emitter terminal of transistor $Q_{64}$ is coupled through resistor $R_{65}$ to the ground potential, while the emitter terminal of transitor $Q_{65}$ is coupled through resistor $R_{64}$ to ground potential.

Figure 7:
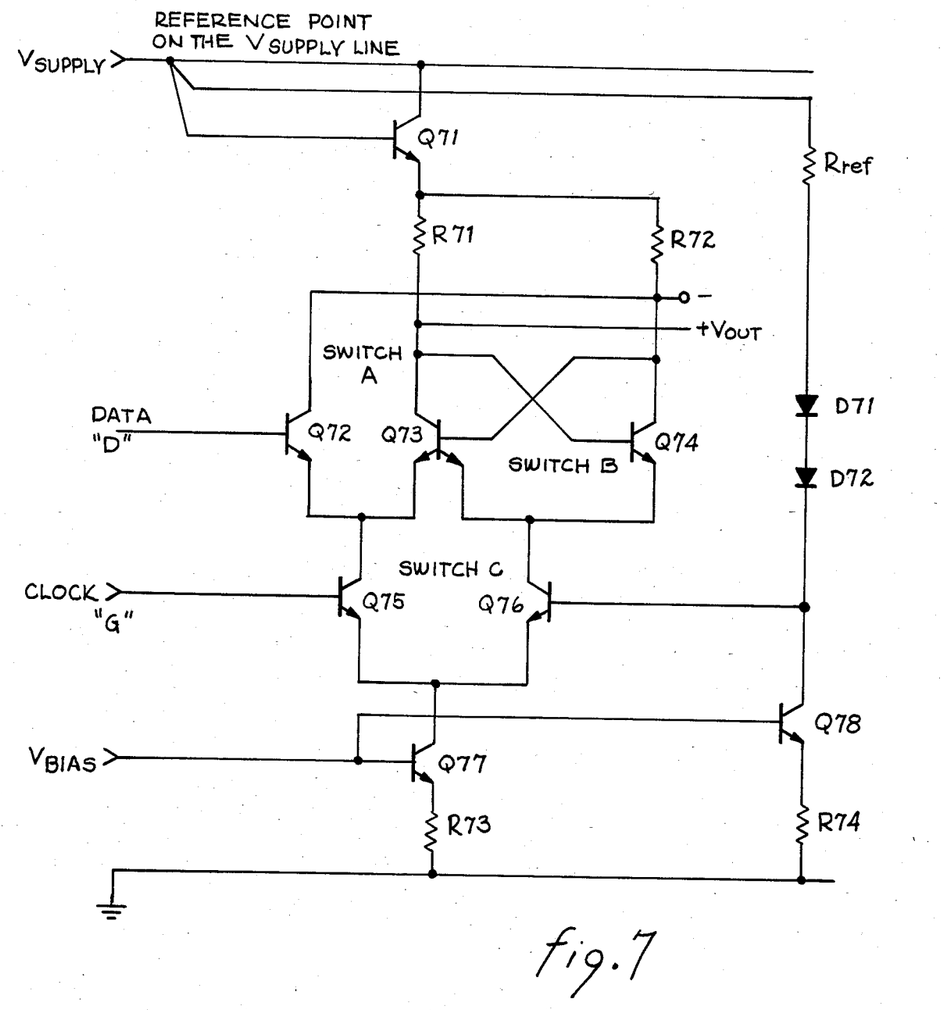
FIG. 7 is a circuit diagram of a basic D-latch implemented in current mode logic according to the instant invention.

Referring now to FIG. 7, a basic D-type latch circuit implemented in current mode logic according to the instant invention is shown. The collector terminal of transistor $Q_{71}$ is coupled to the $V_{supply}$ terminal. The base terminal of transistor $Q_{71}$ is coupled through the sense line to the reference point of the $V_{supply}$ line. This reference point is coupled through resistor $R_{Ref}$ to an anode terminal of diode $D_{71}$. The emitter terminal of transistor $Q_{71}$ is coupled through $R_{71}$ to a collector of $Q_{73}$, to a base terminal of $Q_{74}$ and to the positive terminal of the $V_{out}$ signal, and through resistor $R_{72}$ to the collector terminal of transistor $Q_{74}$, to the base terminal of transistor $Q_{73}$, to the collector terminal of $Q_{72}$ and to the negative terminal of the $V_{out}$ signal. The base terminal of transistor $Q_{72}$ is coupled to the data line, and is the circuit "D" terminal, while the emitter terminal of transistor $Q_{72}$ is coupled to an emitter terminal of transistor $Q_{73}$ and to the collector terminal of transistor $Q_{75}$. A second emitter terminal of transistor $Q_{73}$ is coupled to the emitter terminal of transistor $Q_{74}$ and to a collector terminal of $Q_{76}$. The cathode terminal of diode $D_{71}$ is coupled to the anode terminal of diode $D_{72}$, while the cathode of diode $D_{72}$ is coupled to a base terminal of transistor $Q_{76}$ and to a collector terminal of transistor $Q_{78}$. The base terminal of transistor $Q_{75}$ is coupled to a clock signal, while the emitter terminal of transistor $Q_{75}$ is coupled to the emitter terminal of transistor $Q_{76}$ and to the collector terminal of transistor $Q_{77}$. The emitter terminal of transistor $Q_{77}$ is coupled through resistor $R_{73}$ to the ground potential, while the emitter terminal terminal of transistor $Q_{78}$ is coupled through resistor $R_{74}$ to the ground potential. The $V_{Bias}$ terminal is coupled to the base of transistor $Q_{77}$ and to the base of transistor $Q_{78}$.

Figure 8:
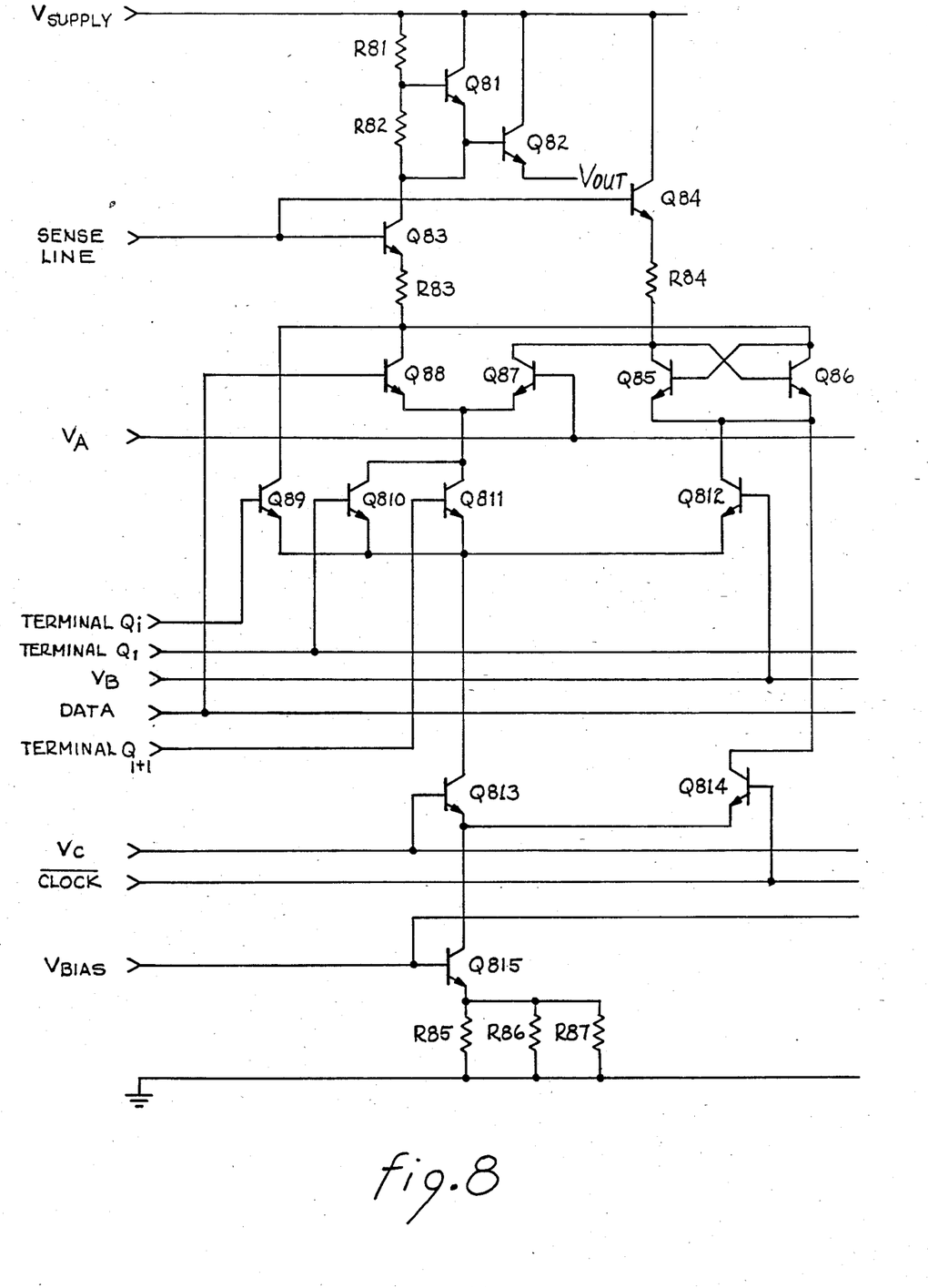
FIG. 8 is a circuit diagram of a data latch element implemented in current mode logic according to the instant invention.

Referring to FIG. 8, a successive approximation data latch circuit implemented in current mode logic according to the instant invention is shown. The $V_{supply}$ terminal is coupled to the collector terminal of transistor $Q_{81}$, through resistor $R_{81}$ to the base terminal of transistor $Q_{81}$, to the collector terminal of transistor $Q_{82}$ and to the collector terminal of transistor $Q_{84}$. The emitter terminal of transistor $Q_{81}$ is coupled to the base terminal of transistor $Q_{82}$, through resistor $R_{82}$ to the base terminal of transistor $Q_{81}$ and to the collector terminal of transistor $Q_{83}$. The emitter terminal of transistor $Q_{82}$ is coupled to the $V_{out}$ terminal. The sense line is coupled to the base terminal of transistor $Q_{83}$ and to the base terminal of transistor $Q_{84}$. The emitter terminal of transistor $Q_{83}$ is coupled through resistor $R_{83}$ to the collector terminal of transistor $Q_{88}$, to the collector terminal of transistor $Q_{89}$, to the collector terminal of transistor $Q_{86}$ and to the base terminal of transistor $Q_{85}$. The emitter terminal of transistor $Q_{84}$ is coupled through resistor $R_{84}$ to a collector terminal of transistor $Q_{85}$, to a base terminal of transistor $Q_{86}$ and to a collector terminal transistor $Q_{87}$. The data line is coupled to the base terminal of transistor $Q_{88}$, while the $V_A$ line is coupled to the base terminal of transistor $Q_{87}$. The emitter terminal of transistor $Q_{88}$ is coupled to the emitter terminal of transistor $Q_{87}$, to the collector terminal of transistor $Q_{810}$ and to the collector terminal of transistor $Q_{811}$. The $Q_i$ terminal line is coupled to the base terminal of transistor $Q_{89}$, while the emitter terminal of transistor $Q_{89}$ is coupled to the emitter terminal of transistor $Q_{810}$, to the collector terminal of transistor $Q_{813}$, to the emitter terminal of transistor $Q_{811}$ and to the emitter terminal of transistor $Q_{812}$. The base terminal of transistor $Q_{810}$ is coupled to the $Q_I$ terminal line, while the base terminal of transistor $Q_{811}$ is coupled to the $Q_{i+1}$ terminal line. The emitter terminal of transistor $Q_{85}$ is coupled to the emitter terminal of transistor $Q_{86}$, to the collector terminal of transistor $Q_{812}$ and to the collector terminal of transistor $Q_{814}$. The base terminal of transistor $Q_{812}$ is coupled to the $V_B$ terminal line. The $V_c$ terminal line is coupled to the base of transistor $Q_{813}$, while the clock terminal is coupled to the base terminal of transistor $Q_{814}$. The emitter terminal of transistor $Q_{813}$ is coupled to the emitter terminal of transistor $Q_{814}$ and to the collector terminal of transistor $Q_{815}$. The base terminal of transistor $Q_{815}$ is coupled to $V_{bias}$, while the emitter terminal of transistor $Q_{815}$ is coupled through resistors $R_{85}$, $R_{86}$, and $R_{87}$ connected in parallel to the ground potential.

Figure 9:
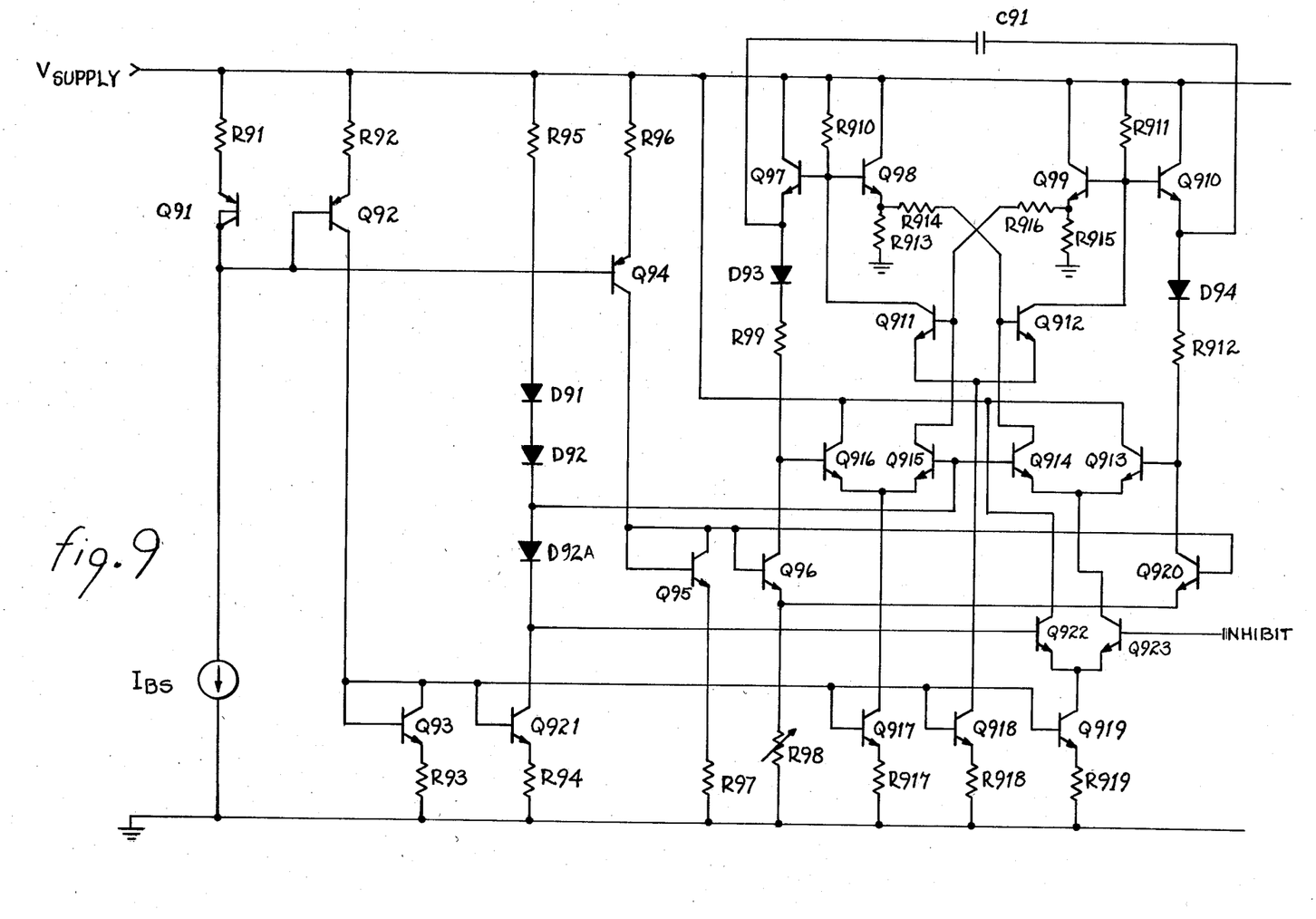
FIG. 9 is a simplified circuit diagram of the clock circuit implemented in current mode logic according to the instant invention.

Referring to FIG. 9, a circuit diagram of a simplified version of the clock circuit implemented in current mode logic according to the instant invention is shown. The $V_{supply}$ line is coupled through resistor $R_{91}$ to the emitter terminal of transistor $Q_{91}$ and through resistor $R_{92}$ to the emitter terminal of transistor $Q_{92}$. The base terminal of transistor $Q_{91}$ is coupled to the collector terminal of transistor $Q_{91}$, to the base terminal of transistor $Q_{92}$, to the base terminal of transistor $Q_{94}$ and through current source $I_{BS}$ to the ground potential. The collector terminal of transistor $Q_{92}$ is coupled to the base and collector of transistor $Q_{93}$, to the base terminal of transistor $Q_{921}$, to the base terminal of transistor $Q_{917}$, to the base terminal of transistor $Q_{918}$ and to the base terminal of transistor $Q_{919}$. The $V_{supply}$ terminal is coupled through resistor $R_{95}$ to the anode terminal of diode $D_{91}$. The cathode terminal of diode $D_{91}$ is coupled to the anode terminal of diode $D_{92}$, while the cathode terminal of diode $D_{92}$ is coupled (A) to the anode terminal of diode $D_{92A}$, while the cathode terminal of diode $D_{92A}$ is coupled to the collector terminal of transistor $Q_{921}$,(B) to the base terminal of transistor $Q_{915}$ and (C) to the base terminal of transistor $Q_{914}$. The emitter terminal of transistor $Q_{93}$ is coupled through resistor $R_{93}$ to the ground potential, while the emitter terminal of transistor $Q_{921}$ is coupled through resistor $R_{94}$ to the ground potential. The $V_{supply}$ terminal is coupled through resistor $R_{96}$ to the emitter terminal of transistor $Q_{94}$, while the collector terminal of transistor $Q_{94}$ is coupled to base terminal of transistor $Q_{95}$, to the collector terminal of the transistor $Q_{95}$, to the base terminal of transistor $Q_{96}$ and to the base terminal of transistor $Q_{920}$. The emitter terminal of transistor $Q_{95}$ is coupled through resistor $R_{97}$ to the ground potential and to the emitter terminal of transistor $Q_{920}$. The $V_{supply}$ terminal is coupled to the collector terminal of transistor $Q_{916}$, to the collector terminal of transistor $Q_{913}$, to the collector terminal of transistor $Q_{97}$, to the collector terminal of transistor $Q_{98}$, to the collector terminal of transistor $Q_{99}$ and to the collector terminal of transistor $Q_{910}$. The base terminal of transistor $Q_{97}$ is coupled through resistor $R_{910}$ to the $V_{supply}$ terminal, to the base terminal of transistor $Q_{98}$, and to the collector terminal of transistor $Q_{911}$. The base of transistor $Q_{99}$ is coupled through resistor $R_{911}$ to the $V_{supply}$ terminal, to the base terminal of transistor $Q_{910}$, and to the collector terminal of transistor $Q_{912}$. The emitter terminal of transistor $Q_{97}$ is coupled through capacitor $C_{91}$ to the emitter terminal of transistor $Q_{910}$ and to the anode terminal of diode $D_{92}$. The cathode terminal of diode $D_{93}$ is coupled through resistor $R_{99}$ to the base terminal of transistor $Q_{916}$ and the collector terminal of transistor $Q_{96}$. The emitter terminal of transistor $Q_{96}$ is coupled through variable resistor $R_{98}$ to the ground potential. The emitter terminal of transistor $Q_{98}$ is coupled through resistor $R_{913}$ to the ground potential and through resistor $R_{914}$ to the base terminal of transistor $Q_{912}$ and the collector terminal of transistor $Q_{914}$. The emitter terminal of transistor $Q_{99}$ is coupled through resistor $R_{915}$ to the ground potential and through resistor $R_{916}$ to the base terminal of transistor $Q_{911}$ and to the collector terminal of transistor $Q_{915}$. The emitter terminal of transistor $Q_{911}$ is coupled to the emitter terminal of transistor $Q_{912}$ and to the collector of transistor $Q_{918}$. The emitter terminal of transistor $Q_{910}$ is coupled to the anode terminal of diode $D_{94}$. The cathode terminal of diode $D_{94}$ is coupled through the resistor $R_{912}$ to the base terminal of transistor $Q_{913}$ and to the collector terminal of transistor $Q_{920}$. The emitter terminal of transistor $Q_{914}$ is coupled to the emitter terminal of transistor $Q_{913}$ and to the collector terminal of transistor $Q_{919}$. The emitter terminal of transistor $Q_{916}$ is coupled to the emitter terminal of transistor $Q_{915}$ and to the collector terminal of transistor $Q_{917}$. The emitter terminal of transistor $Q_{917}$ is coupled through resistor $R_{917}$ to the ground potential. The emitter terminal of transistor $Q_{918}$ is coupled through resistor $R_{918}$ to the ground potential and the emitter terminal of transistor $Q_{919}$ is coupled through resistor $R_{919}$ to the ground potential.

Figure 10:
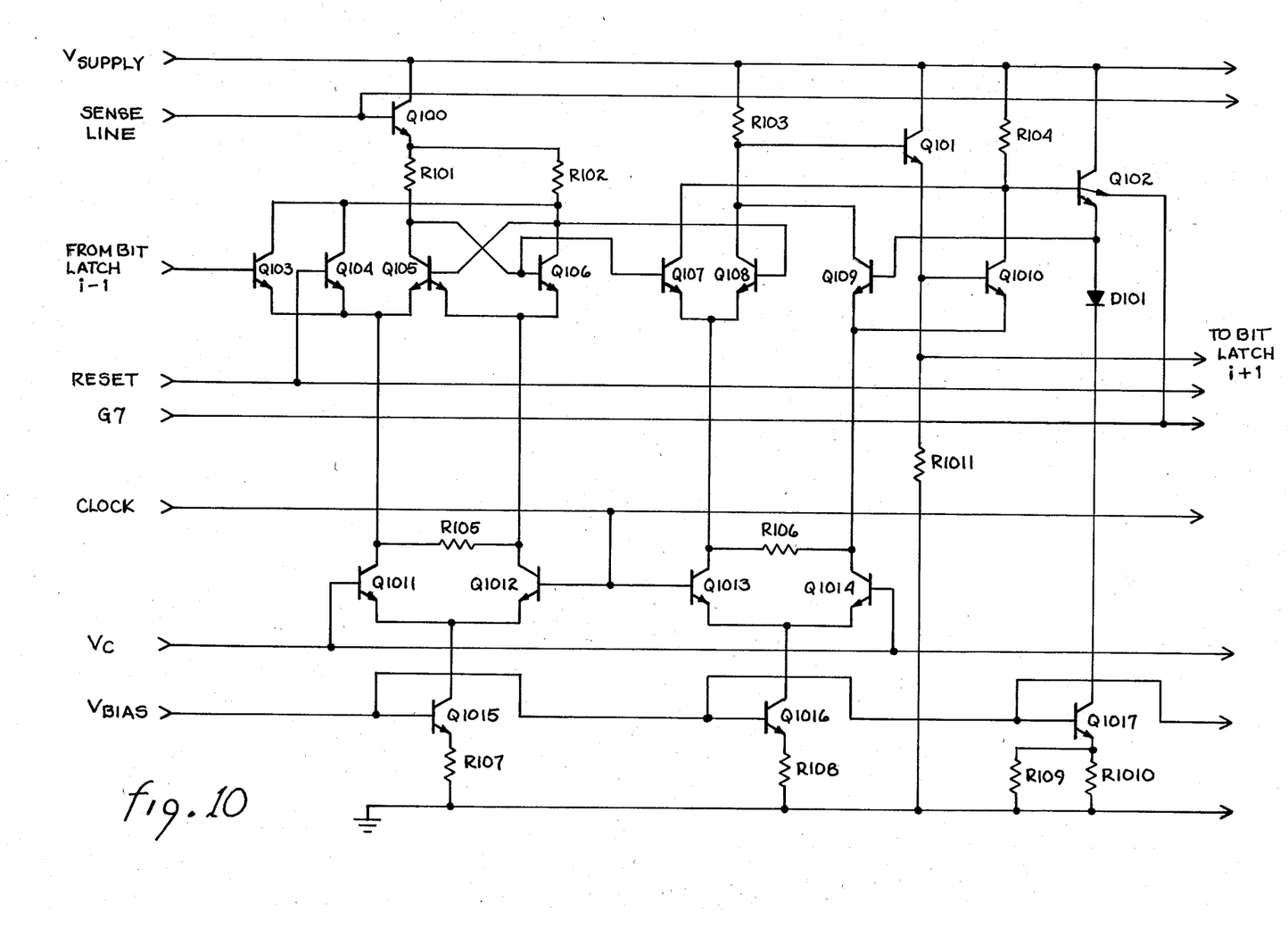
FIG. 10 is a schematic circuit diagram of a D-type bistable multivibrator or flip-flop circuit implemented in current mode logic according to the instant invention.

Referring to FIG. 10, a circuit diagram of a flip-flop circuit implemented in current mode logic according to the instant invention is shown. The $V_{supply}$ terminal is coupled to a collector terminal of transistor $Q_{100}$. A base terminal of transistor $Q_{100}$ is coupled to a supply sense line. An emitter terminal of transistor $Q_{100}$ is coupled through resistor $R_{101}$ to a collector terminal of transistor $Q_{105}$, to a base terminal of transistor $Q_{106}$ and to a base terminal of transistor $Q_{107}$; and is coupled through a resistor $R_{102}$ to a collector terminal of transistor $Q_{103}$, to a collector terminal of transistor $Q_{104}$, to a collector terminal of transistor $Q_{106}$ to a base terminal of transistor $Q_{105}$ and to a base terminal of transistor $Q_{108}$. The terminal from the bit latch i-1 is coupled to a base terminal of transistor $Q_{103}$. The $V_{supply}$ terminal is coupled through $R_{103}$ to a base terminal of transistor $Q_{101}$, to a collector terminal of transistor $Q_{108}$ and to a collector terminal of transistor $Q_{109}$. The $V_{supply}$ terminal is coupled to a collector terminal of transistor $Q_{101}$. The $V_{supply}$ terminal is coupled to a collector terminal of transistor $Q_{102}$ and through resistor $R_{104}$ to base terminal of transistor $Q_{102}$, to a collector terminal of transistor $Q_{1010}$ and to a collector terminal of transistor $Q_{107}$. One emitter terminal of transistor $Q_{102}$ is coupled to a terminal of logic OR gate 141, while a second emitter terminal of transistor $Q_{102}$ is coupled to an anode terminal of diode $D_{101}$ and to a base terminal of transistor $Q_{109}$. The emitter terminal of transistor $Q_{101}$ is coupled to a base terminal of transistor $Q_{1010}$, to the i+1 flip-flop, and through resistor $R_{1011}$ to the ground potential. The cathode of diode $D_{101}$ is coupled to a collector terminal of transistor $Q_{1017}$. The reset terminal is coupled to a base terminal of transistor $Q_{104}$. The emitter terminal of transistor $Q_{103}$ is coupled to an emitter terminal of transistor $Q_{104}$, to an emitter terminal of transistor $Q_{105}$, to a collector terminal of transistor $Q_{1011}$ and to one terminal of resistor $R_{105}$. A second emitter terminal of transistor $Q_{105}$ is coupled to an emitter terminal of transistor $Q_{106}$, to a collector terminal of transistor $Q_{1012}$ and to a second terminal of resistor $R_{105}$. An emitter terminal of transistor $Q_{107}$ is coupled to an emitter terminal of transistor $Q_{108}$, to a collector terminal of transistor $Q_{1013}$ and to a first terminal of resistor $R_{106}$. An emitter terminal of transistor $Q_{1010}$ is coupled to an emitter terminal of transistor $Q_{109}$, to a collector terminal of transistor $Q_{1014}$, and to a second terminal of resistor $R_{106}$. The clock terminal is coupled to a base terminal of transistor $Q_{1012}$ and to a base terminal of transistor $Q_{1013}$. The $V_c$ terminal is coupled to a base terminal of transistor $Q_{1011}$ and to a base terminal of transistor $Q_{1014}$. The emitter terminal of transistor $Q_{1012}$ is coupled to the emitter terminal of transistor $Q_{1011}$ and to a collector terminal of transistor $Q_{1015}$. An emitter terminal of transistor $Q_{1013}$ is coupled to an emitter terminal of transistor $Q_{1014}$ and to a collector terminal of transistor $Q_{1016}$. The $V_{bias}$ terminal is coupled to a base terminal of transistor $Q_{1015}$, to a base terminal of transistor $Q_{1016}$ and to a base terminal of transistor $Q_{1017}$. The emitter terminal of transistor $Q_{1015}$ is coupled through rresistor $R_{107}$ to the ground potential, while an emitter terminal of transistor $Q_{1016}$ is coupled through resistor $R_{108}$ to the ground potential. An emitter terminal of transistor $Q_{1017}$ is to the ground potential through resistors $R_{109}$ and $R_{1010}$, connected in parallel.

DESCRIPTION OF THE PREFERRED EMBODIMENT

Referring again to FIG. 1, the operation of the successive approximation register (SAR) 1 can be understood in the following manner. An input signal, to be approximated by the SAR 1, is applied to signal comparison network 3. An initiate signal is applied to the SAR 1 and initiates operation. Bit 1, the most significant hit of the SAR 1 is placed in the "on" (positive logic) state and applied to digital-to-analog converter (DAC) 2, while the lower order bit signal lines are in the "off" (negative logic) state position. As a result of the application of the bit 1 on signal to the DAC 2, an output voltage equal to ½ of the full scale voltage range is applied to the signal comparison network 3. If the output signal of the DAC 2 is larger than the input signal, the state of the compare signal causes bit 1 to be latched in an "off" state. If the output signal of the DAC 2 is smaller than the input signal, the state of the compare signal causes bit 1 to be latched in the "on" state. Next, bit 2 of the SAR 1 is placed in the "on" state, the lower order bit lines remaining in the "off" state. The output signal of DAC 2 is the result of the application of bit 2 and bit 1 (if latched in the "on" state by the previous operation), which is ½+¼ of the full scale input voltage range and this DAC output signal is compared with the input signal in comparison network 3. If the DAC output signal is less than input signal, bit 2 is latched in the "on" state. If the DAC output signal is greater than the input signal, then bit 2 of the ADC 1 is latched in the "off" state. The bit signal lines are activated in order of decreasing significance until the last bit (n) line has been activated and the DAC output signal resulting from activation of bit n and the combination of bit lines latched in the "on" state is compared with the input signal. The nth bit line is latched in the "on" state when the DAC output signal is lower than the input signal. Otherwise, the nth bit position line is latched in the "off" state. The resulting group of n signal bits provides, when applied to a comparable digital-to-analog device, a signal that is the closest approximate signal less than the input signal that is allowed by the granularity of the DAC output signal responding to the group of n activation signals.

The general operation of the circuit used in the successive approximation technique can be understood as follows. Referring FIG. 2 the sequence of bi-stable multivibrators or flip-flops 120–122 determines the approximation bit under tes and determines the latch circuit that will store a bit state as a result of the test. The reset signal forces bit 1, the most significant bit to an "on" state and the other n-1 bits to an "off" state. The clock circuit activating the sequence of flip-flop circuits moves the "on" state to the next lesser significant bit position permitting a comparison of this "on" state summed with the previous stored bit states with the signal under approximation. This state (or the opposite state) will be stored, depending on the result of the test. On the last clock period of the approximation procedure, the "on" state is shifted out of the sequencer, leaving all bit states in an "off" state. The logic OR gate 141 falls to an "off" state halting the clock circuit, applying a reset signal and providing an operation complete signal. The waveforms at the Q output terminal of Bit 1 and the $\overline{Q}$ output terminals of bits i and n of the sequencer flip-flops are shown in waveforms 3, 4 and 5 respectively of FIG. 3.

Referring again to FIG. 2, in the interval between activity of the successive approximation analog-to-digital converter, the clock apparatus is inactive and the clock output is in a low signal level or state. All of the $\overline{Q}$ output signals for the sequencer flip-flops (121 and 122) and the $\overline{Q}$ output signal for sequencer flip-flop 120 are in a low state. The output of the logic OR gate 141 (of FIG. 2) is in a low state and data latch 110 is in a gated condition. The reset line is high and is applied to data latch 110 through logic NOR gate 111, forcing the Q terminal of data latch 110 to a low state. The Q terminal of data latch 110 is referred to as the successive approximation register (SAR) data line.

The operation of the clock circuits and the subsequent rising edge of the clock pulse (of FIG. 3) forces the Q terminal of flip-flop 120 to a high state, while the $\overline{Q}$ terminals of the other flip-flops remain in a low state. Data latch 110 changes to a latched condition holding the SAR data line in a low state during the positive or "HIGH" half cycle of the clock pulse between 1 and 2. The decoding logic controlling the data latches causes the data latches, 150 through 160 through 170, to enter a gated condition where the inverse of the signal applied to terminal D is applied to terminal $\overline{Q}$, thereby setting $\overline{Q}$ of flip-flop 150 to a low state and the $\overline{Q}$ terminals of the other flip-flops to a high state. When the falling edge of the first clock pulse occurs, data latch 110 enters a gated state causing the Q output to be equal to the inverse of the $\overline{COMP}$ input and data latches 150-170 are in a latched condition. On the rising edge of the second clock pulse, a high state is applied to the $\overline{Q}$ terminal of the second flip-flop of the sequencer, while all other $\overline{Q}$ terminals of the flip-flops in the sequencer are in a low state. The data latch 110 latches the signal from the comparator circuit ($\overline{COMP}$) on the SAR data line. This signal state determines the output state of the $\overline{Q}$ terminal of the data latch 150, resulting in the most significant bit signal decision. The control logic at the G and D terminals of the remaining data latch circuits insure that only data latch 150 is influenced by the SAR data line, in essence because of the signals from the associated flip-flop circuits in the sequencer. The rising edge of the second clock pulse also forces the $\overline{Q}$ terminal of the second data latch to a low state. The low state of the $\overline{Q}$ terminal causes the second bit of the DAC to operate for the test comparison of signals. The converter continues to operate from the most significant bit position to the least significant bit position. A shift along the sequencer elements occurs with each rising edge of the clock pulses. The particular sequencer flip-flop currently activated determines which approximation bit is under test. It causes the $\overline{Q}$ output of the slave data latch for that bit to be determined by the comparison decision on the Data Line. In addition it forces the Q output of the first lesser significant bit to a "Low" state turning "on" that DAC bit. These events occur at the next rising edge of the clock signal.

The final rising edge of the sequence of clock pulses causes the high state to be removed from the /OVs/Q/ terminal of sequencer flip-flop 122. The Q terminal of flip-flop 120 and the $\overline{Q}$ terminal of the remainder of the flip-flops are in the low condition, the output of logic OR gate falls to a low state indicating that the conversion process is complete. The output of logic OR gate 141 interrupts the clock circuit operation at the completion of the present cycle, provides an output signal indicating that the conversion is complete and sets the reset line to a high state in preparation for the next coversion sequence.

Referring again to FIGS. 4, 5, and 6, the circuits disclosed are a switch circuit, a logic AND gate circuit and a logic OR gate circuit implemented in current mode logic.

Referring now to FIG. 7, the operation of the data latch circuit 110 of FIG. 2 can be understood in the following manner. A gate input signal in the form of a clock pulse is applied to the base terminal of transistor $Q_{75}$ (the "G" input). A reference voltage equal to the mean value of gate input signal variation is applied to the base terminal of transistor $Q_{76}$. Thus, the state of the gate input signal selects transistor $Q_{75}$ or transistor $Q_{76}$ to conduct the current from transistor $Q_{77}$. If transistor $Q_{75}$ conducts, then transistor $Q_{72}$ or transistor $Q_{73A}$ conducts depending on the level of the voltage signal applied to the base of transistor $Q_{72}$. The current flows through resistor $R_{71}$ or resistor $R_{72}$, providing the logical output signal. This condition is referred to as the gated condition because the logical state is determined by the base terminal voltage applied to transistor $Q_{72}$. If the output signal is stable and the signal applied to the base terminal of transistor $Q_{75}$ falls to its low state, then transistor $Q_{76}$ conducts current and transistor $Q_{73B}$ or transistor $Q_{74}$ becomes conducting. Because the base terminals and collector terminals are cross coupled, the output state determines which of these devices is conducting and the device that is in the conducting state provides the output state. This state is the latched condition and in this state the output signal is not controlled by the input signal because transistor $Q_{75}$, transistor $Q_{72}$ and transistor $Q_{73A}$ are not in the conducting state.

The input signal to all of the differial switches is single ended, the signal being applied to only one side of the switching element, while the other side is biased with a reference voltage to which the input signal is compared. This method of electrical coupling saves space on the chip by reducing the number of metal runs, but has the problem in retention of good offset comparison because the reference level and the signal level voltage originate from different locations on the chip. Because of voltage drop in the conductors, offset voltage levels can vary. This problem can be reduced by the use of transistor $Q_{71}$ shown on FIG. 7. The line connected to the base terminal of transistor $Q_{71}$ is also coupled to the base terminal of an equivalent transistor in each logic circuit cell. This line also connects directly to the point in the logic power supply where the reference voltage is generated. Because the metal conductor carries only the base current of the transistors, the line current is small and the line serves as a sense line to the origin location of the reference voltage. Because the output of each logic cell is referenced to this equivalent base voltage for each equivalent transistor, then this output voltage is closely related to the reference voltage and the offset problem is reduced.

The circuit of FIG. 7 has the elements of a current source, transistor $Q_{77}$, differential pairs of transistors and load resistors $R_{71}$ and $R_{77}$. The current source transistor provides a bias current proportional to temperature. The differential pairs of transistors guide the current through the appropriate load transistor to perform the logic function.

Referring again to FIG. 8, the operation of the individual data latches and associated control logic for the individual data latches, except data latch 150, is shown. The operation of these data latches is similar to the operation of the flip-flop elements described below except only one latch is needed, the state of the data line is latched by data latch circuit 110 when latch circuit 110 is not gated. Thus, a single master data latch circuit (110) serves all twelve slave data latch circuits and provides for edge-triggered operation. Transistor $Q_{815}$ provides the current source for the data latch. The bias current is applied via transistor $Q_{813}$ to the data input elements (transistors $Q_{88}$ and $Q_{87}$) when the $\overline{\text{clock}}$ signal is less than the reference signal $V_c$. It is applied through transistor $Q_{814}$ to the latched output elements (comprising transistors $Q_{85}$ and $Q_{86}$) when the clock input signal is greater than $V_c$. The control logic is implemented by transistors $Q_{89}$, $Q_{810}$, $Q_{811}$ and $Q_{812}$ which provide further current steering inputs (i.e., controlled by the flip-flop elements). The data latch circuits (except for data latch 150) can be acted upon during three clock intervals. During the clock pulse 1, bits 2-n are set to a logic "1" and bit 1 is reset unconditionally to "0". During the ith clock pulse, bit i is unconditionaly reset to logic "0". During the (i+1)th clock pulse, bit i is latched to the state of the internal data bus. No other clock pulses affect the ith data latch. With reference also the FIG. 3, in the first half of any clock interval, the clock pulse is high. During the first half of clock pulse 1, $\overline{\text{clock}}$ is low and transistor $Q_{813}$ is conducting. Also during this inverval, the $Q_1$ line is high, causing transistor $Q_{810}$ to become conducting. A low condition is latched on the data line by the master data latch circuit. This combination of input signals causes the data latch to reset (i.e. $\overline{Q}=1$) through the D (DATA) input terminal. (i.e. the base terminal of $Q_{88}$) The $Q_1$ line, the DATA line, and the CK line are connected to all the slave data latches (except the data latch 150) in the same manner, so all of the logic signals are reset. During the second half of the clock interval, clock becomes high, turning on transistor $Q_{814}$ for all of the slave data latches and causing them to be latched unconditionally. Data latch i remains latched until the ith clock pulse because the base terminal of transistor $Q_{810}$, $Q_{811}$, and $Q_{89}$ all have low logic signals applied thereto during this interval. The bias current is steered through transistor $Q_{812}$ placing the data latch in a latched condition under all clock conditions. The next relevent clock pulse to data latch i is the ith clock pulse. During the first half of this clock period $\overline{\text{clock}}$ is in a low state, steering bias current through transistor $Q_{813}$ and the ith flip-flop terminal $\overline{Q}$ becomes high, causing transistor $Q_{89}$ to become conducting. This change causes data latch i to set unconditionally ($\overline{Q}$ is low) regardless of the states of the other input signals. The set output condition latches during the second half of the clock cycle, holding bit i at the digital-to-analog converter in the on state for the full ith clock period, and allowing the comparator result to control the internal (SAR) data line. On the next high clock pulse, the (i+1)th output of the sequencer is in the high condition. This output signal is connected to the base of transistor $Q_{811}$ causing that transistor to conduct. This transistor state enables the differential transistor pair $Q_{88}$ and $Q_{87}$, which provide the D input to the data latch circuit. With the D input enabled, the data latch output responds to the condition on the internal DATA line and the bit i decision is complete. The second half of the (i+1)th clock period causes the ith output signal to be latched to a state representing the decision data. The ith data latch output signal is not affected by any subsequent clock periods until after the reset signal. This result occurs because the signals at the bases of $Q_{89}$, $Q_{810}$ and $Q_{811}$ are all low until after the reset. The operation of data latch 150 is slightly different because this circuit turns on the digital-to-analog converter during the first clock pulse and therefor has no clock 1 reset provision. This mode of operation eliminates the need for transistor $Q_{810}$. The level of the output signal at the $V_{OUT}$ terminal, when latched, can indicate if the ith component is present in the digital approximation of the input signal.

Referring once again to FIG. 9, the operation of the simplified clock circuit can be described as follows. The clock is a cross-coupled multivibrator circuit with first order frequency stability determined by the termperature drift of an MOS capacitor and a NiChrome resistor. The technology is compatible with the current mode logic used in the remainder of successive approximation analog to digital converter and has inhibit functions allowing synchronization with the operation of the converter and permitting short cycle operation. The switching nucleus of the clock circuit is a bistable multivibrator, having a pair of cross coupled transistors. The base of the conducting transistor is forced low by a switch current source which is controlled by the voltage across a capacitor. The capacitor time constant controls the switching frequency of the clock. The multivibrator pair is shown as transistor $Q_{911}$ and $Q_{912}$, which are biased by the current source transistor $Q_{918}$. The switched current sources which lower the voltages applied to the bases of the multivibrator pair are transistors $Q_{915}$ and $Q_{914}$. The transistors $Q_{916}$ and $Q_{913}$ provide the switching inputs to those current sources. The current source input signals are controlled by the voltage across capacitor $C_{91}$ level shifted through diode $D_{93}$. The voltage across capacitor $C_{91}$ is a linear ramp with the dV/dt determined by the value of the capacitor and the current in current source transistors $Q_{96}$ and $Q_{920}$.

The accuracy of the frequency of the clock circuit can be explained by describing the switching cycle and mathematically describing the relationship between the change in voltage on the capacitor and the switching threshold of the switched current source transistors. The threshold voltage Vth is given by:

$$Vth = (-I_{bs} \times R_{95}) - (2 \times V_{be})$$

where $I_{bs}$ is the circuit bias current and $V_{be}$ is the voltage across a diode. The change in voltage across the capacitor can be determined by observing that, at the instant of switching, transistor $Q_{912}$ or transistor $Q_{911}$ is cut off, while the other transistor is on. The input of one of the switched current source transistors ($Q_{913}$ or $Q_{916}$) is at the switching threshold voltage. If transistor $Q_{912}$ is taken to be the "off" transistor, the one plate of the capacitor is at $-V_{be}$ and the other plate is at $Vth+V_{be}$. The voltage across the capacitor is therefore given by:

$$V_{c1} = -V_{be} - (Vth + V_{be}) = I_{bs} \times R_{95}.$$

By symmetry considerations, $V_{c1}$ is equal in magnitude and opposite in sign at the other switching transition. The change in capacitor voltage is therefore $2 \times V_{c1}$.

The clock frequency is set by the time between the switching transition. This time is determined by $$T = C_{91} \times (V_{c1}/I_{c91})$$

where $I_{c91}$ = the current in $C_{91}$ $$T = C_{91} \times (2 \times I_{bs} \times R_{95}/I_{c91}).$$

$I_{c91}$ is the collector current of transistor $Q_{96}$ or transistor $Q_{920}$. The value is given by:

$$I_{c91} = I_{bs} \times R_{97}/R_{98}.$$

Therefore $$T = C_{91} \times 2 \times R_{95} \times R_{98}/R_{97}.$$

Both $R_{95}$ and $R_{97}$ are both p-base type resistors and therefore have the same temperature drift. The ratio is therefore constant. The temperature drift of the Temperature T is then determined by the time constant of $C_{91}$ and $R_{98}$. The drift at both of these elements is small, $C_{91}$ being an MOS capacitor and $R_{98}$ being a NiChrome resistor. The differential switch consisting of transistors $Q_{922}$ and $Q_{923}$ serves to inhibit the clock when the conversion is complete. When the Inhibit line is in the "High" state, the bias current from $Q_{919}$ flows through $Q_{923}$ and activates the switch consisting of transistors $Q_{914}$ and $Q_{913}$. This condition permits clock operation.

When the Inhibit signal is in the "Low" state then the bias current from transistor $Q_{919}$ flows through transistor $Q_{922}$ which is connected to the $+V_{supply}$ line. This circuit status deactivates the differential switch consisting of $Q_{913}$ and $Q_{914}$ and the timing signal is not transmitted to the base of $Q_{912}$ and the clock is inhibited.

Referring once again to FIG. 10, the operation of the bistable multivibrator or flip-flop circuits will be described. In the preferred embodiment, 12 edge triggered D-type flip-flop elements are arranged to provide signals in sequence to the associated data latch circuits. Logic OR gates are coupled to the D input terminal of all of the fip-flop circuits except the first circuit. Only the reset line is coupled to the D terminal of the first flip-flop (120). The flip-flop circuits can be described as being partitioned into a master and slave D type latch set with a 2 phase clock. Transistors $Q_{103}$, $Q_{104}$, $Q_{105}$, $Q_{106}$, $Q_{1011}$, $Q_{1012}$, and $Q_{1015}$ form the master latch circuit, while transistors $Q_{107}$, $Q_{108}$, $Q_{109}$, $Q_{1010}$, $Q_{1014}$, $Q_{1013}$ and $Q_{1016}$ form the slave latch. These two circuits form basic elements in the sequencing apparatus and therefore it will be necessary to describe the operation of only one circuit, the master latch circuit. The bias current, provided by current source transistor $Q_{1015}$ is steered by the inputs of differential pairs to provide the desired logic function. The differential pair $Q_{1012}$ and $Q_{1011}$ provide the G input that is coupled to Clock. When Clock is low, the bias current is steered through transistor $Q_{1011}$ to the emitter terminals of transistors $Q_{103}$, $Q_{104}$ and $Q_{105}$. These three transistors are configured as a low gain differential amplifier, which passes the logical OR of the two inputs (i.e., the bases of $Q_{103}$ and $Q_{104}$) to the differential output at the collectors of transistors $Q_{104}$ and $Q_{105}$. Thus when Clock is low, a "1" condition at the input terminal, D1 (i.e., the base terminal of transistor $Q_{103}$) or the reset line, D2 (i.e., the base terminal at transistor $Q_{104}$) will cause the output state to be "1." The output state is "1" when the collector of transistor $Q_{105}$ is high and the collector of transistor $Q_{104}$ is low. A "0" condition on both D1 and D2 causes an "0" output condition. When input Clock switches to a high condition, the bias current from transistor $Q_{1015}$ is steered through transistor $Q_{1012}$ providing current for the emitter of transistor $Q_{105}$ and transistor $Q_{106}$ and cutting off the emitter current in transistors $Q_{103}$, $Q_{104}$ and $Q_{105}$. Transistors $Q_{105}$ and $Q_{106}$ are configured as a latch circuit, thus the output is held in the state which was present just prior to the rising edge of Clock. If the inputs D1 and D2 should change while Clock is high, there is no effect on the output state. In summary, the sequencing circuit consists of 12 cascaded D type flip-flops which are edge triggered to the rising edge of the clock. These flip-flops have the property that the state of the D input terminal, just prior to a trigger edge, is transferred to the output terminals just after the trigger edge and that the output state is then held until a next trigger edge. The D type flip-flop is implemented by a pair of nearly identical D-type latchs.

Referring to FIGS. 8 and 10, it will be clear to those skilled in the art that the differential amplifiers have single-ended inputs that are compared against reference voltages (i.e., $V_a$ and $V_b$). The use of the single-ended implementation reduces the number of elements and complexity of the circuit design.

The above description is included to illustrate the operation of the preferred embodiment and is not means to limit the scope of the invention. The scope of the invention is to be limited only by the following claims. From the above description, many variations would be apparent to one skilled in the art that would get the encompassed by the spirit and scope of the invention.

What is claimed is:

1. A successive approximation register for receiving an input signal, comprising:
   a plurality of data latch circuits;
   a plurality of flip-flop circuits, each of said flip-flop circuits coupled to a one of said data latch circuits, said plurality of flip-flop circuits adapted to activate said coupled data latch circuits in a sequential order, each of said activated data latch circuits providing a first signal to be applied to output terminals, said activated data latch circuit storing said first or a second signal in response to said input signal; and
   a master data latch circuit coupled to said plurality of data latch circuits, said master data latch circuit applying an output signal to said plurality of data latch circuits determined by said input signal.

2. The successive approximation register of claim 1 further including a clock circuit, said clock circuit activated in response to an initiate signal, said clock circuit causing said flip-flop circuits to activate said data latch circuits in sequential order.

3. The successive approximation register of claim 1 or 2 wherein said circuits are implemented with current mode logic components and compatible components, said converter being fabricated on a single semiconductor chip.

4. The successive approximation register of claim 1 wherein said circuits include a voltage sensing means for compensating for a voltage drop in conducting leads coupling said circuits with a power supply.

5. The successive approximation register of claim 2 wherein said clock circuit includes a differential amplifier for developing a constant clock period over a range of temperatures.

6. The successive approximation register of claims 1 or 2 wherein input signals of said differential circuits are coupled in a single ended mode and compared against a one of a plurality of reference voltages.

7. For use in conjunction with a digital-to-analog converter and a comparator circuit, apparatus for providing successive approximation analog-to-digital conversion responsive to a condition signal and an initial signal comprising:
   a clock circuit for providing a series of pulses in response to said initial signal;

a plurality of slave data latch circuits enabled in a predetermined sequence in response to said clock pulses, each of said enabled slave data latch circuits applying a preselected logic signal to an output terminal when said slave data latch circuit is enabled; and a master latch circuit coupled to said plurality of slave data latch circuits for receiving said condition signal and said preselected logic signal, said master latch causing a logic signal to be stored in said enabled slave data latch circuit determined by said condition signal upon activation of a next slave data latch in said predtermined sequence.

8. The apparatus for providing an analog-to-digital conversion of claim 7 further including a plurality of flip-flop circuits coupled to said clock circuit for sequentially activating said plurality of data latch circuits, wherein activation of all of said flip-flop circuits causes a signal to terminate said clock pulses.

9. The apparatus for providing an analog-to-digital conversion of claim 8 wherein said apparatus is a circuit element implemented in current mode logic technology.

10. The apparatus for providing an analog-to-digital conversion of claim 7 wherein said circuits include a sense line means for minimizing conductor voltage drop between said elements and a power supply.

11. A circuit element for storing a multiplicity of logic signal states in response to a multiplicity of condition signals comprising:

a clock circuit for providing a sequence of pulses;

a multiplicity of flip-flop circuits coupled to said clock circuit, said clock pulses activating said multiplicity of flip-flop circuits in a predetermined sequence;

a multiplicity of slave data latch circuits, each slave data latch circuit associated with a one of said flip-flop circuits and activated when said associated flip-flop is activated, said slave data latch circuits initially applying a predetermined logic signal when activated; and a master latch circuit coupled to said slave latch circuits for receiving said multiplicity of condition signals, wherein said slave data latch stores a logic state related to said condition signals when a test sequential flip-flop circuit is activated.

12. The circuit element of claim 11 wherein said circuit element is implemented in current mode logic technology.

13. The circuit element of claim 12 wherein said flip-flop circuits and said data latch circuits have a sense line means for minimizing effects of a potential voltage drop along conductors.

14. The circuit element of claim 12 wherein differential amplifiers in said data latch and flip-flop circuits are configured in a single-input mode.

15. The circuit element of claim 12 wherein said clock circuit includes differential switch pairs; and, means for developing a constant current ratio in said differential switch pairs over a range of temperatures.

16. The circuit element of claim 12 wherein activation of a last flip-flop circuit halts said sequence of pulses.

* * * * *